United States Patent

Von Basse et al.

[11] Patent Number: 5,825,701
[45] Date of Patent: Oct. 20, 1998

[54] MEMORY CELL ARRANGEMENT OF MEMORY CELLS ARRANGED IN THE FORM OF A MATRIX

[75] Inventors: Paul-Werner Von Basse, Wolfratshausen; Roland Thewes, Puchheim; Doris Schmitt-Landsiedel, Ottobrunn; Michael Bollu, Munich, all of Germany

[73] Assignee: Siemens Aktiengesellschaft, Munich, Germany

[21] Appl. No.: 682,022

[22] Filed: Jul. 16, 1996

[30] Foreign Application Priority Data

Sep. 13, 1995 [DE] Germany ............... 195 33 951.7

[51] Int. Cl.[6] ................................. G11C 7/00
[52] U.S. Cl. ........................... 365/203; 365/210
[58] Field of Search ......................... 365/203, 210

[56] References Cited

U.S. PATENT DOCUMENTS 3,848,236  11/1974  Troutman ................... 340/173 R
5,414,663   5/1995  Komarek et al. ................ 365/203

FOREIGN PATENT DOCUMENTS 195 14 834.7  of 0000  Germany.

Primary Examiner—David C. Nelms
Assistant Examiner—Michael T. Tran
Attorney, Agent, or Firm—Hill & Simpson

[57] ABSTRACT

The memory cell arrangement has MOS transistors (10) connected between bitlines (4, $4_1$) and connected row-by-row by means of selection lines (5). For pre-charging of all the bitlines (4, $4_1$) without a blocking of an access to these lines, further MOS transistors (20), connected between the bitlines (4, $4_1$) and a supply line (7), are provided, whose gate terminals ($20_2$) are connected to a common pre-charging line (6).

12 Claims, 2 Drawing Sheets

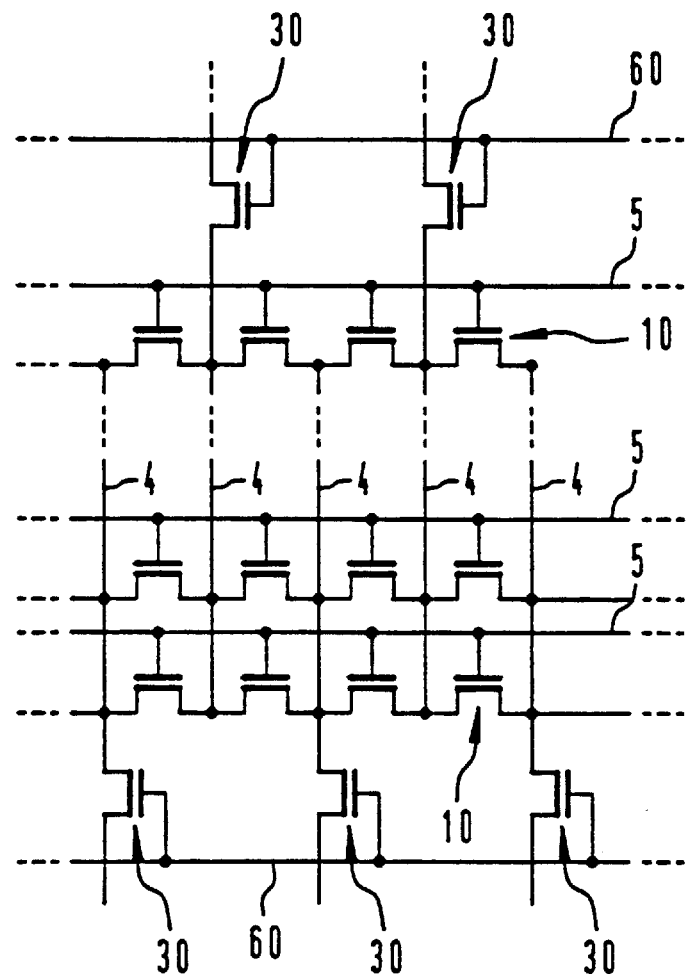

MEMORY CELL ARRANGEMENT OF MEMORY CELLS ARRANGED IN THE FORM OF A MATRIX

BACKGROUND OF THE INVENTION

The present invention concerns a memory cell arrangement in which the memory cells are arranged. Each of the memory cells comprises an MOS transistor that has a source terminal, a drain terminal and a gate terminal.

In German patent application P 195 14 834.7, a memory cell arrangement of the cited type is proposed in which the bitlines have such a small spacing that, while MOS transistors can be placed between two bitlines, no transistors having a source or drain terminal connection to a pre-charge voltage can be arranged next to one another at the ends of the bitlines. A direct contacting of the bitlines to a wiring layer is also not possible, due to reasons of space.

However, such connections are necessary for the pre-charging of the bitlines to determined initial potentials. Due to the narrow grid, transistors that are in parallel to one another can be placed only on every second bitline. In order to reach all bitlines, the remaining bitlines can be provided with transistors at the other end. If these transistors were used only for pre-charging, the access to the bitlines would be blocked for the data transfer. Pre-charging and data transfer together can be realized only via a complicated circuit arrangement at the ends of the bitlines.

By means of the present invention an arrangement of the type described above is made available in which a pre-charging of all bitlines is advantageously enabled without a blocking of the access to the bitlines, in particular to their ends.

In general terms the present invention is a memory cell arrangement of memory cells arranged in rows and columns in the form of a matrix, each of which has an MOS transistor respectively having a source terminal, drain terminal and gate terminal. Each column is arranged between two adjacent bitlines, and an allocated selection line runs respectively along each row. Each transistor of a column or row is connected to the two adjacent bitlines via its source terminal and drain terminal. Each transistor of a row or column is connected to the allocated selection line via its gate terminal. Between two adjacent bitlines and between at least one determined bitline and a determined electric potential there is arranged respectively at least one further MOS transistor respectively having a source terminal, drain terminal and gate terminal. The further MOS transistor is connected, via its source terminal and drain terminal, to the two adjacent bitlines, or to the determined bitline and the determined potential. The gate terminals of further MOS transistors are connected to a common pre-charging line for the alternative charging of the bitlines to the determined potential V.

Advantageous developments of the present invention are as follows.

Two or several determined bitlines are provided, each of which is connected to the determined potential, via the source terminal and the drain terminal of a respective further MOS transistor connected to the pre-charging line with its gate terminal.

Two or several pre-charging lines are provided for the alternative pre-charging of the bitlines to the determined potential, to each of which are connected further MOS transistors with their gate terminal, each of which is arranged between two adjacent bitlines, or between at least one determined bitline and the determined potential, and is connected with its source and drain terminal to these adjacent bitlines, or to this determined bitline and the determined potential.

The determined potential lies on at least one potential line that runs next to at least one determined bitline.

The arrangement has N bitlines and K potential lines, which are arranged one after the other in a row direction or a column direction, as well as M selection lines and L pre-charging lines, which are arranged one after the other in a column direction or a row direction. The K potential lines are distributed among the N bitlines and the L pre-charging lines are distributed among the M selection lines such that I bit lines lie between respectively one of two outer edges of the arrangement that lie opposite one another and that respectively run crosswise to the selection lines, and, respectively, one of the outermost K potential lines lying proximate to this edge. Also, J selection lines lie between one respectively of two outer edges of the arrangement that lie opposite one another and respectively run along the selection lines, and, respectively, one of the outermost L pre-charging lines lying proximate to this edge. I is chosen essentially equal to N/(2·K), and J is chosen essentially equal to M/(2·L), and N, M, K and L respectively designate natural numbers.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 3 is a memory arrangement of a previous type, in which transistors lying in parallel are arranged at the end of every second bitline, and transistors, likewise lying in parallel, are arranged for pre-charging at the ends of the remaining bitlines lying opposite these ends.

DESCRIPTION OF THE PREFERRED EMBODIMENTS

Figure 1:
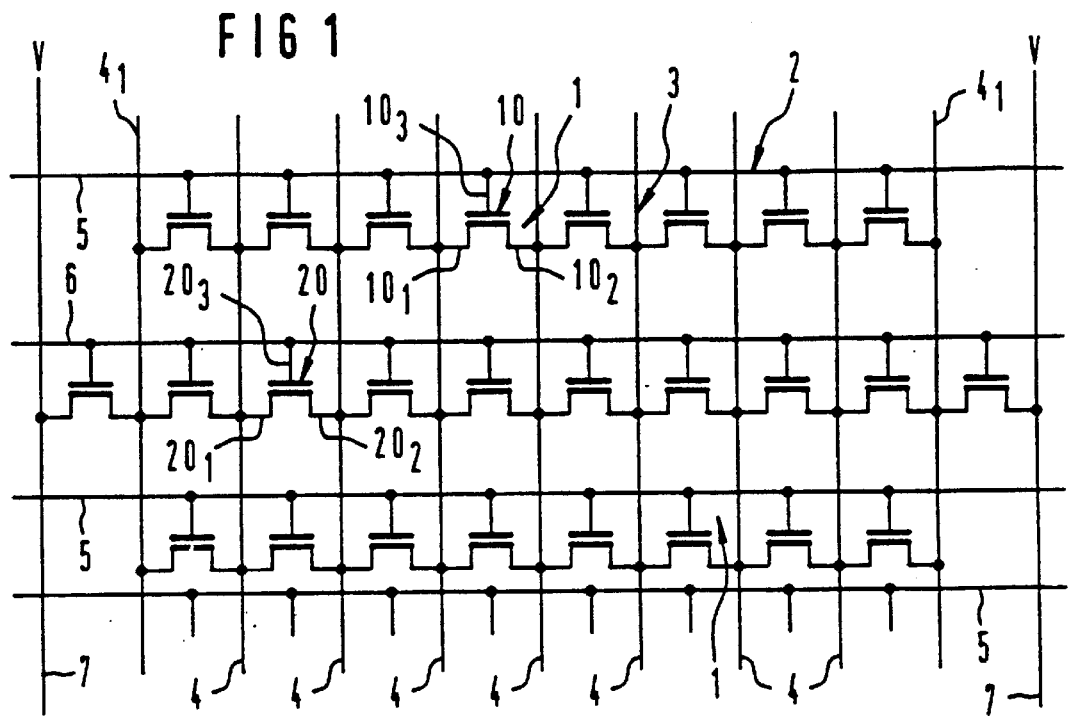
FIG. 1 is a schematic diagram showing a segment of an inventive memory arrangement.

The inventive memory cell arrangement according to FIG. 1 consists of memory cells 1 arranged in rows 2 and columns 3 in the form of a matrix, each of which comprises an MOS transistor 10 respectively having a source terminal $10_1$, drain terminal $10_2$ and gate terminal $10_3$.

Each column 3 is arranged between two neighboring bitlines 4, 4 or 4, $4_1$. Each row 2 could just as well be arranged between two adjacent bitlines 4, 4 or 4, $4_1$.

In the first-named case, an allocated selection line 5 runs respectively along each row 2. In the second-named case, in which the columns 3 are replaced by the rows 2 and the rows 2 by the columns 3, an allocated selection line 5 runs respectively along each column 3.

The following specification relates to the first-named case, but also holds analogously for the second-named case.

Each transistor 10 of a column 3 is connected, via its source terminal $10_1$ and drain terminal $10_2$, to the bitlines 4, 4 or 4, $4_1$ adjacent to this transistor 10, and each transistor 10 of a row 2 is connected, via its gate terminal $10_3$, to the selection circuit 5 allocated to this transistor 10.

According to the present invention, at least one further MOS transistor 20, have respectively a source terminal $20_1$, drain terminal $20_2$ and gate terminal $20_3$. Respective further transistors 20 are arranged respectively between two adjacent bitlines 4, 4 or 4, $4_1$, and between at least one determined bitline $4_1$ and a determined electrical potential V. The respective further transistor 20 is connected, via its source terminal $20_1$ and drain terminal $20_2$, to the bitlines 4, 4 or 4, $4_1$ adjacent to this further transistor 20, or to the determined bitline $4_1$ and the determined potential V.

The gate terminals $20_3$ of these further MOS transistors 20 are connected to a common pre-charging line 6 for the alternative pre-charging of the bitlines 4 and $4_1$ to the determined potential V.

The determined potential V preferably lies on a potential line 7, for example a supply line that runs next to the determined bitline $4_1$. In developments described later, several bitlines 7 and/or several determined bitlines $4_1$ are present, to which one or two potential lines 7 are adjacent. A determined bitline $4_1$ means a bitline 4 to which at least one potential line 7 is adjacent.

The inventive memory cell arrangement according to FIG. 1 functions for example as follows.

All bitlines 4 and $4_1$, as well as all selection lines 5 and the pre-charge line 6, are at a low potential $V_0$, for example, zero potential. Only the potential line 7, which runs next to the determined bitline $4_1$, lies at the determined potential V, which is, for example, higher in relation to the low potential $V_0$, and which is, for example, the supply voltage for the arrangement. All the MOS transistors 10 and further MOS transistors 20 are blocked under these circumstances.

As soon as the pre-charging line 6 is brought to the determined higher potential V from the low potential $V_0$, all further transistors 20 whose gate terminals $20_3$ are connected to this pre-charge line 6 become conductive. All bitlines 4 and $4_1$ are connected with one another through the further transistors 20, and also with the potential line 7. By this means, the bitlines 4 and $4_1$ are pre-charged to the desired determined potential V via the conductive chain of further transistors 20, from the potential line 7. The same also holds for individual bitlines 4 or $4_1$ that are discharged during the reading process. These individual bitlines 4 or $4_1$ also draw their charge in part from the adjacent bitlines 4 or $4_1$.

In large fields of memory cells 1, the charging process would be of very long duration due to high-ohm bitlines 4 and $4_1$ and high-ohm pre-charge lines 6. This charging time can be substantially reduced if two or several determined bitlines $4_1$ are provided. In this case each of the determined bitlines $4_1$ are connected to the determined potential V via the source terminal $20_1$ and the drain terminal $20_2$ of a respective further MOS transistor 20 connected to the pre-charging line 6 with its gate terminal $20_3$. In addition or alternatively charging time is reduced if two or several pre-charging lines 6 are provided for the alternative pre-charging of the bitlines 4 and $4_1$ to the determined potential V, to each of which are connected further MOS transistors 20 with their gate terminal $20_3$. Each of these further transistors 20 is arranged between two adjacent bitlines 4, 4 or 4, $4_1$, or between at least one determined bitline $4_1$ and the determined potential V, and is connected with its source terminal $20_1$ and drain terminal $20_2$ to these adjacent bitlines 4, 4 or 4, $4_1$, or to this determined bitline $4_1$ and the determined potential V.

Figure 2:
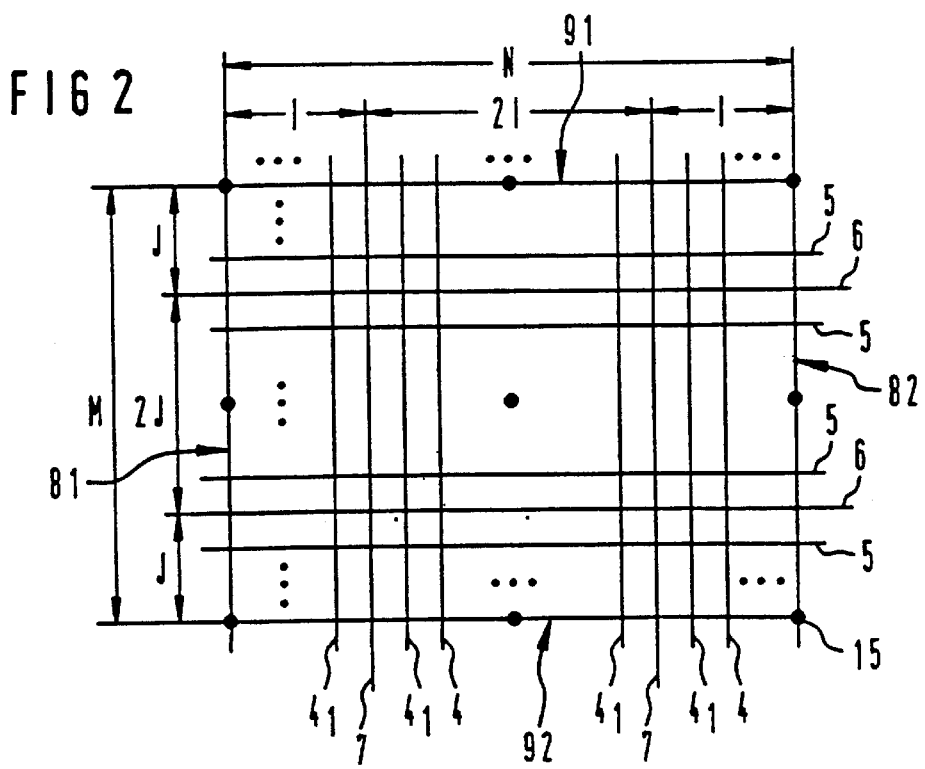
FIG. 2 is a highly simplified representation of an inventive memory arrangement having several pre-charging lines and potential lines.

An arrangement of this sort, in which both possibilities are advantageously realized, is shown in FIG. 2 in a highly schematized representation. In this FIG. 2, essentially only pairs of edges lying opposite one another 81, 82 and 91, 92 of the memory cell field of the inventive arrangement, some potential lines 7, some bitlines 4 and determined bitlines $4_1$, some selection lines 5 and some pre-charging lines 6 are shown. The remaining potential lines 7, bitlines 4 and determined bitlines $4_1$, selection lines 5 and pre-charging lines 6, to the extent that they are present, and the transistors 10 and further transistors 20 are omitted.

The arrangement according to FIG. 2 consists of a total of N bitlines 4 and $4_1$ and K potential lines 7, arranged one after the other in the row direction, as well as of M selection lines 5 and L pre-charging lines 6, arranged one after the other in the column direction.

The K potential lines 7 are distributed among the bitlines 4 or, respectively, $4_1$, and the L pre-charging lines 6 are distributed among the M selection lines 5. As a result, between respectively one of two outer edges 81, 82 of the arrangement that lie opposite one another and that respectively run crosswise to the selection lines 5, and, respectively, one of the outermost K potential lines 7 shown in FIG. 2 and lying proximate to this edge 81 or, respectively, 82, there lie respectively I bitlines 4, $4_1$. Also, between respectively one of two outer edges 91, 92 of the arrangement that lie opposite one another and respectively run along the selection lines 5, and respectively one of the outermost L pre-charging lines 6 shown in FIG. 2 and lying proximate to this edge 91 or, respectively, 92, there lie respectively J selection lines 5. N, M, K and L are respectively natural numbers.

An optimal distribution of all the lines for the acceleration B of the charging process is obtained if: I is chosen essentially equal to $N/(2 \cdot K)$; and J is chosen essentially equal to $M/(2 \cdot L)$.

For predetermined N, K, M and L, remainders may result for I and J as a result of the divisions. Such remainders must be distributed over the groups of bitlines 4, $4_1$ lying between the potential lines 7 and/or the groups of selection lines 5 lying between the pre-charging lines 6, so that the total numbers N and/or M result.

The acceleration B of the charging process can be in relation to the exemplary embodiment according to FIG. 1, in which only two potential lines 7 outside the bitlines 4 and $4_1$ and a single pre-charging line 6 in the center of the field of memory cells 1 are present. The acceleration B is given approximately by $B \approx L^2 \cdot K^2$.

Accordingly, the acceleration of the charging process depends quadratically on the number L of the pre-charging lines 6 and on the number K of the potential lines 7. For example, for L=2 and K=2, an acceleration by a factor of 16 results for the slowest charging points, emphasized in FIG. 2 by black points 15.

In the inventive arrangement, it is advantageous in any case if both the potential lines 7 and the pre-charging lines 6 can be connected with low resistance.

The memory arrangement of the previous type, shown in FIG. 3 for purposes of comparison, has only the bitlines 4, selection lines 5 and MOS transistors 10 whose connection is as in the inventive arrangement. Counted from left to right, every second bitline 4 has at one end, for example, the lower end in FIG. 3, respectively one MOS transistor 30 connected in parallel, wherein the gate terminals of these transistors 30 are connected to a common pre-charging line 60. The remaining bitlines 4 also have MOS transistors 30 connected in parallel at their upper ends, whose gate terminals are likewise connected to a common pre-charging line 60.

If the transistors 30 were used exclusively for pre-charging, the access to the bitlines 4 would be blocked for the data transfer. Pre-charging and data transfer together can be realized in an arrangement according to FIG. 3 only via a complicated circuit arrangement at the ends of the bitlines 4.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A memory cell arrangement of memory cells arranged in rows and columns in the form of a matrix, each memory cell having an MOS transistor having a source terminal, drain terminal and gate terminal, comprising:

a plurality of adjacent bitlines and a plurality of selection lines;

each column of said columns arranged between two adjacent bitlines of said plurality of bitlines, and an allocated selection line of said plurality of selection lines respectively running along each row of said rows;

each transistor of a column or row of said columns or rows connected to respectively two adjacent bitlines of said plurality of bitlines via its source terminal and drain terminal, and each transistor of a row or column of said rows or columns connected to a respective allocated selection line via its gate terminal; and at least one further MOS transistor connected respectively between two adjacent bitlines of said plurality of bitlines and between at least one respective bitline and a respective electric potential, said at least one further MOS transistor respectively having a source terminal, a drain terminal and a gate terminal, said at least one further MOS transistor being connected, via its source terminal and drain terminal, to the two respective adjacent bitlines, or to the respective bitline and the respective potential, gate terminals of further MOS transistors being connected to a common pre-charging line for alternative charging of the bitlines to the respective potential V.

2. The arrangement according to claim 1, wherein at least two respective bitlines are provided, and wherein each of said at least two respective bitlines is connected to the respective potential via the source terminal and the drain terminal of a respective further MOS transistor that is connected to the pre-charging line with its gate terminal.

3. The arrangement according to claim 2, wherein the arrangement further comprises N bitlines and K potential lines, which are arranged one after the other in a row direction or a column direction, as well as M selection lines and L pre-charging lines, which are arranged one after the other in a column direction or a row direction, and wherein the K potential lines are distributed among the N bitlines and the L pre-charging lines are distributed among the M selection lines such that I bitlines lying between respectively one of two outer edges of the arrangement that lie opposite one another and that respectively run crosswise to the selection lines, and, respectively, one of the outermost K potential lines lying proximate to this edge, and J selection lines lying between respectively one of two outer edges of the arrangement that lie opposite one another and respectively run along the selection lines, and, respectively, one of the outermost L pre-charging lines lying proximate to this edge, where I is equal to $N/(2 \cdot K)$, and J is equal to $M/(2 \cdot L)$, and N, M, K and L respectively designate natural numbers.

4. The arrangement according to claim 1, wherein at least two pre-charging lines for alternative pre-charging of the bitlines to the respective potential, and wherein each of said at least two pre-charging lines are connected to further MOS transistors via their gate terminals, and wherein each of said further MOS transistors is arranged between two adjacent bitlines or between at least one respective bitline and the respective potential, and wherein each of said further MOS transistors is connected with its source and drain terminal to said adjacent bitlines, or to said respective bitline and the respective potential.

5. The arrangement according to claim 1, wherein the respective potential is on at least one potential line that runs next to at least one respective bitline.

6. A memory cell arrangement of memory cells arranged in rows and columns in the form of a matrix, each memory cell having an MOS transistor having a source terminal, drain terminal and gate terminal, comprising:

a plurality of adjacent bitlines, a plurality of selection lines and at least two respective bitlines;

each column of said columns arranged between two adjacent bitlines of said plurality of bitlines, and an allocated selection line of said plurality of selection lines respectively running along each row of said rows;

each transistor of a column or row of said columns or rows connected to respectively two adjacent bitlines of said plurality of bitlines via its source terminal and drain terminal, and each transistor of a row or column of said rows or columns connected to a respective allocated selection line via its gate terminal;

at least one further MOS transistor connected respectively between two adjacent bitlines of said plurality of bitlines and between at least one respective bitline and a respective electric potential, said at least one further MOS transistor respectively having a source terminal, a drain terminal and a gate terminal, said at least one further MOS transistor being connected, via its source terminal and drain terminal, to the two respective adjacent bitlines, or to the respective bitline and the respective potential, gate terminals of further MOS transistors being connected to a common pre-charging line for alternative charging of the bitlines to the respective potential V; and each of said at least two respective bitlines connected to the respective potential via the source terminal and the drain terminal of a respective further MOS transistor that is connected to the pre-charging line with its gate terminal.

7. The arrangement according to claim 6, wherein at least two pre-charging lines for alternative pre-charging of the bitlines to the respective potential, and wherein each of said at least two pre-charging lines are connected to further MOS transistors via their gate terminal, and wherein each of said further MOS transistors is arranged between two adjacent bitlines or between at least one respective bitline and the respective potential, and wherein each of said further MOS transistors is connected with its source and drain terminal to said adjacent bitlines, or to said respective bitline and the respective potential.

8. The arrangement according to claim 6, wherein the respective potential is on at least one potential line that runs next to at least one respective bitline.

9. The arrangement according to claim 6, wherein the arrangement further comprises N bitlines and K potential lines, which are arranged one after the other in a row direction or a column direction, as well as M selection lines and L pre-charging lines, which are arranged one after the other in a column direction or a row direction, and wherein the K potential are being distributed among the N bitlines and the L pre-charging lines are distributed among the M selection lines such that I bitlines lying between respectively one of two outer edges of the arrangement that lie opposite one another and that respectively run crosswise to the selection lines, and, respectively, one of the outermost K potential lines lying proximate to this edge, and J selection lines lying between respectively one of two outer edges of the arrangement that lie opposite one another and respectively run along the selection lines, and, respectively, one of the outermost L pre-charging lines lying proximate to this edge, where I is equal to $N/(2 \cdot K)$, and J is equal to $M/(2 \cdot L)$, and N, M, K and L respectively designate natural numbers.

10. A memory cell arrangement of memory cells arranged in rows and columns in the form of a matrix, each memory cell having an MOS transistor having a source terminal, drain terminal and gate terminal, comprising:

N bitlines, K selection lines, M selection lines and L pre-charging lines the N bitlines and K potential lines, being arranged one after the other in a row direction or a column direction, the M selection lines and L pre-charging lines, being arranged one after the other in a column direction or a row direction, the K potential lines being distributed among the N bitlines and the L pre-charging lines being distributed among the M selection lines such that I bitlines lying between respectively one of two outer edges of the arrangement that lie opposite one another and that respectively run crosswise to the selection lines, and, respectively, one of the outermost K potential lines lying proximate to this edge, and J selection lines lying between respectively one of two outer edges of the arrangement that lie opposite one another and respectively run along the selection lines, and, respectively, one of the outermost L pre-charging lines lying proximate to this edge, where I is equal to $N/(2 \cdot K)$, and J is equal to $M/(2 \cdot L)$, and N, M, K and L respectively designate natural numbers;

each column of said columns arranged between two adjacent bitlines of said N bitlines, and an allocated selection line of said K selection lines respectively running along each row of said rows;

each transistor of a column or row of said columns or rows connected to respectively two adjacent bitlines of said N bitlines via its source terminal and drain terminal and each transistor of a row or column of said rows or columns connected to a respective allocated selection line via its gate terminal;

at least one further MOS transistor connected respectively between two adjacent bitlines of said N bitlines and between at least one respective bitline and a respective electric potential, said at least one further MOS transistor respectively having a source terminal, drain terminal and gate terminal, said at least one further MOS transistor connected, via its source terminal and drain terminal, to the two respective adjacent bitlines, or to the respective bitline and the respective potential, gate terminals of further MOS transistors being connected to a common pre-charging line for alternative charging of the bitlines to the respective potential V; and each of said at least two respective bitlines connected to the respective potential via the source terminal and the drain terminal of a respective further MOS transistor that is connected to the pre-charging line with its gate terminal.

11. The arrangement according to claim 10, wherein at least two pre-charging lines for alternative pre-charging of the bitlines to the respective potential, and wherein each of said at least two pre-charging lines are connected to further MOS transistors via their gate terminal, and wherein each of said further MOS transistors is arranged between two adjacent bitlines or between at least one respective bitline and the respective potential, and wherein each of said further MOS transistors is connected with its source and drain terminal to said adjacent bitlines, or to said respective bitline and the respective potential.

12. The arrangement according to claim 10, wherein the respective potential is on at least one potential line that runs next to at least one respective bitline.

* * * * *